United States Patent
Gregoire

(10) Patent No.: US 6,836,229 B2
(45) Date of Patent: Dec. 28, 2004

(54) AUTOMATIC GAIN CONTROL METHOD

(75) Inventor: Jean-Philippe Gregoire, Jalhay (BE)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/716,654

(22) Filed: Nov. 19, 2003

(65) Prior Publication Data

US 2004/0130470 A1 Jul. 8, 2004

(30) Foreign Application Priority Data

Jan. 8, 2003 (EP) .............................. 03250110

(51) Int. Cl.[7] .......................... H03M 1/62; H03M 1/84; H03M 1/88
(52) U.S. Cl. ...................... 341/139; 341/143; 341/155; 375/345; 455/232.1; 455/234.1
(58) Field of Search ................................ 341/139, 143, 341/155; 375/345; 455/232.1, 234.1

(56) References Cited

U.S. PATENT DOCUMENTS

| | | | | |
|---|---|---|---|---|
| 5,389,927 A | * | 2/1995 | Turney et al. ............... | 341/139 |
| 5,469,115 A | | 11/1995 | Peterzell et al. ............ | 330/129 |
| 5,566,201 A | | 10/1996 | Ostman ....................... | 375/200 |
| 5,946,607 A | * | 8/1999 | Shiino et al. ............. | 455/234.1 |
| 6,038,435 A | | 3/2000 | Zhang ...................... | 455/234.1 |
| 6,259,391 B1 | * | 7/2001 | Pakravan et al. ........... | 341/139 |
| 6,292,120 B1 | * | 9/2001 | Painchaud et al. .......... | 341/139 |
| 6,563,891 B1 | * | 5/2003 | Eriksson et al. ............ | 375/345 |
| 6,606,047 B1 | * | 8/2003 | Borjesson et al. .......... | 341/155 |
| 6,668,027 B1 | * | 12/2003 | Scarpa ....................... | 375/345 |
| 6,690,312 B1 | * | 2/2004 | Falkenberg et al. ......... | 341/144 |

OTHER PUBLICATIONS

"ADC and Radio Performance Optimization For UMTS System", Research Disclosure, Kenneth Mason Publications, p.763, May 2001.

"Optimum Gain Control For A/D Conversion Using Digitized I/Q Data In Quadrature Sampling", K.M. Cho, IEEE Transactions On Aerospace And Electronic Systems, vol. 27, No. 1, 1991, pp. 178–181.

* cited by examiner

*Primary Examiner*—Michael Tokar
*Assistant Examiner*—Khai Nguyen

(57) ABSTRACT

A method of providing an automatic gain control (AGC) in a receiver structure includes multiplying a received analogue signal with a predetermined gain setting to obtain an amplifier output signal, sampling the amplifier output signal, estimating the energy in the samples, calculating the average energy, computing the percentage of clipped samples, calculating the target energy value based on the average energy and the percentage of clipped samples and the gain setting, and applying the update receiver gain setting.

5 Claims, 4 Drawing Sheets

AUTOMATIC GAIN CONTROL METHOD

FIELD OF THE INVENTION

The present invention is related to an automatic gain control (AGC) circuit that is commonly used in communication systems for controlling the received RF signal power.

STATE OF THE ART

In a communication system there generally is an AGC circuit at the receiver side to keep under control the signal levels that enter the Analogue-to-Digital converter. There can be several possible effects that cause strong variations in the RF signal received. Too strong an input signal of the A/D converter may lead to clipping of the digitised signal. From the viewpoint of precision it is advantageous to use as well as possible the ADC dynamic range. To optimise the receiver performance it is important to use as many bits as possible of the A/D converter (i.e. high precision/resolution) but to clip as few samples as possible. The Automatic Gain Control (AGC) should be set such that both goals are reached.

In a typical prior art solution the signal from the RF part enters an adjustable gain amplifier. The control of the amplifier gain is the task of a block called 'Energy estimation & gain calculation'. The main goal of this block is to optimise the input level of the A/D Converter. To obtain a high resolution the gain should be large, whereas to avoid clipping the gain should be small. Thus there is a trade off between less clipping and greater precision at the output of the ADC.

The classical method is to measure the energy (or amplitude) of the signal coming out the ADC and average it over a certain period of time (equal to 1 slot for a 3G device e.g.). For every slot the result of the average energy is compared to a target energy and if target< energy then the gain is lowered; if target> energy then the gain is increased.

The disadvantage of this method is that it is very difficult to set the target energy at a fixed value and to find a good compromise between clipping and precision.

In the literature a lot of patents and papers can be found on the topic of Automatic Gain Control. They all present variations to the classical AGC scheme with small improvements. The closest related patents found are documents U.S. Pat Nos. 6,038,435, 5,566,201 and 5,469,115. They all present more or less the same global scheme (power measurement, integration thereof, computation of the gain and feedback to variable amplifier) but with little difference in the gain computation method.

SUMMARY OF THE INVENTION

The present invention aims to provide a novel method to perform the Automatic Gain Control (AGC) in a receiver structure, allowing both a high precision at the output of the A/D converter and a low clipping level. The invention also aims to provide an apparatus making use of this method.

The present invention is related to a method to provide an automatic gain control (AGC) in a receiver structure, comprising the following steps: multiplying a received analogue signal with a predetermined gain setting to obtain an amplifier output signal, sampling the amplifier output signal, estimating the energy in the samples, calculating the average energy, characterised in that the method further comprises the steps of computing the percentage of clipped samples, calculating the target energy value, based on the average energy and the percentage of clipped samples, and the gain setting and applying the updated receiver gain setting.

Advantageously, in the method according to the invention a lower and upper limit are set for the target energy value and the target energy value is calculated as follows:

if clipping percentage is below the lower limit, the target energy value is increased, if the clipping percentage is between lower and upper limit the target energy value remains unchanged, if the clipping percentage is above the upper limit the target energy value is decreased.

As a second object the present invention is related to an automatic gain control apparatus to control the received RF power, comprising an adjustable gain amplifier arranged for amplifying a received signal, an A/D converter arranged for generating samples of the amplified signal, a clipping & energy estimation block, arranged for the calculation of the clipping percentage and the average energy of the sampled signal and a gain calculation block, arranged for determining the target energy value for sampled signals and the gain setting of said adjustable gain amplifier.

Advantageously the AGC apparatus is incorporated in a receiver apparatus.

In a specific embodiment of the present invention, an integrated circuit or a set of integrated circuit devices comprising an automatic gain control apparatus according to the present invention is disclosed.

SHORT DESCRIPTION OF THE DRAWINGS

DETAILED DESCRIPTION OF THE INVENTION

Figure 1:
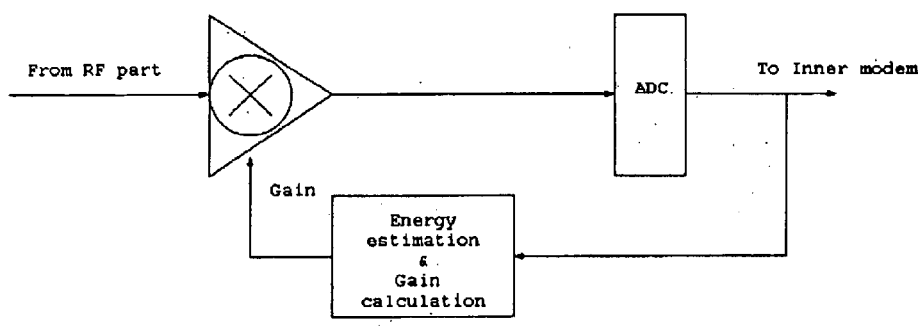
FIG. 1 represents the prior art AGC block scheme.
Figure 2:
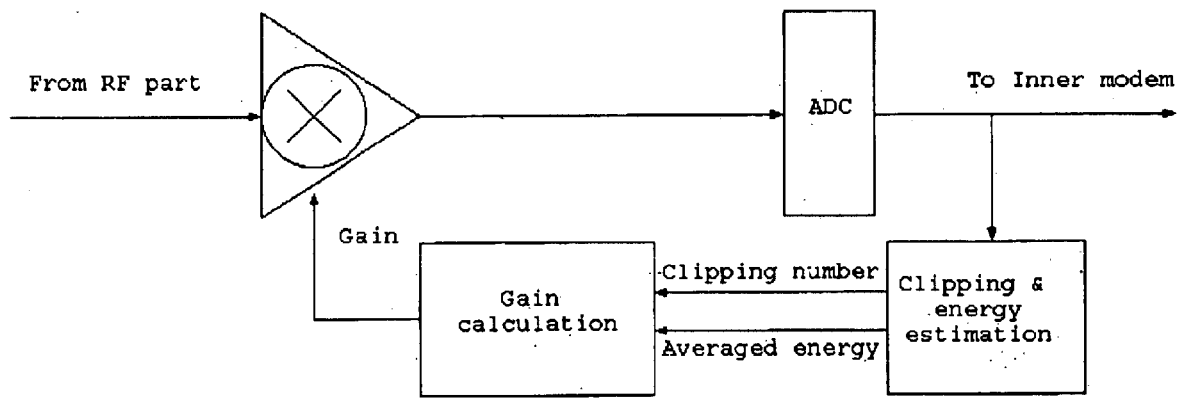
FIG. 2 represents the new AGC scheme according to the invention.

The AGC block representing the invention is shown in FIG. 2. As opposed to prior art methods as in FIG. 1 the target energy is now changed dynamically.

In a typical prior art solution the signal from the RF part enters an adjustable gain amplifier (1). The control of the amplifier gain is the task of a block called 'Energy estimation & gain calculation' (3). The main goal of this block is to optimise the input level of the A/D Converter (2).

In the method of the invention the energy is estimated and averaged over one period, as in the classical AGC method. In addition to that, the clipping percentage is also computed. Both functions are performed by (see FIG.2) the Clipping & Energy Estimation block (3'). The 2 results are sent every period time to the 'Gain calculation' block (4'). This block derives the gain on the same base as classical AGC (if target<energy then lower gain; if target>energy then increase the gain).

In contrast with the classical AGC methods, the target energy is not fixed but can vary on the base of the clipping percentage. A new parameter called 'clipping percentage range' is therefore introduced. It includes a lower and an upper limit. The target energy is then set as follows:

If the percentage of clipped samples is greater than the upper limit then TARGET=TARGET−STEP_TARGET, If percentage of clipped samples is less than the lower limit then TARGET=TARGET+STEP_TARGET, If the percentage of clipped samples falls between the limits, there is no change in TARGET.

The value of STEP_TARGET will determine the dynamic of the change of the target.

Example for calculating the gain:

GAIN=GAIN*(1+Cste*(TARGET−ENERGY))

Cste is a constant, which is set at the beginning and also can control the system dynamic.

The gain setting is then passed to the gain amplifier (1) to be used in the next signal period.

The main advantage of this method is the separation of the setting of 'more precision at the ADC (2) output' and the setting of 'low clipping at the ADC output'.

One can set the clipping level one wants and automatically keep maximum precision at the ADC output. If the variance or average of the incoming signal changes, the new AGC scheme will automatically adapt its target energy to a more optimal value. E.g. if the variance becomes much smaller (with the same average) it means that the gain may become larger to have the same amount of clipping. Making the gain larger will increase the ADC resolution and thus increase the receiver performance. In a classical scheme with fixed target energy, the target energy will be fixed such that in any case a lot of clipping is avoided. So even when the gain could be larger because the variance of the signal drops, still the gain will remain the same and the ADC precision is not used optimally, resulting in a worse performance. With a classical AGC scheme, having less clipping means having low precision. With a dynamically adjustable target energy, the output is always optimal.

One now has control on every parameter (clipping and resolution), as well as on the dynamics. As a consequence, adapting the AGC block to any situation becomes easier.

The following example illustrates the difference between the classical and the novel approach, in case of an incoming signal with some changes in the signal dynamics. The example makes clear the main advantage lies in taking into account of the signal dynamics: the algorithm will always try to keep the clipping rate constant instead of having a constant averaged amplitude. This leads to a more efficient use of the ADC.

Figure 3:
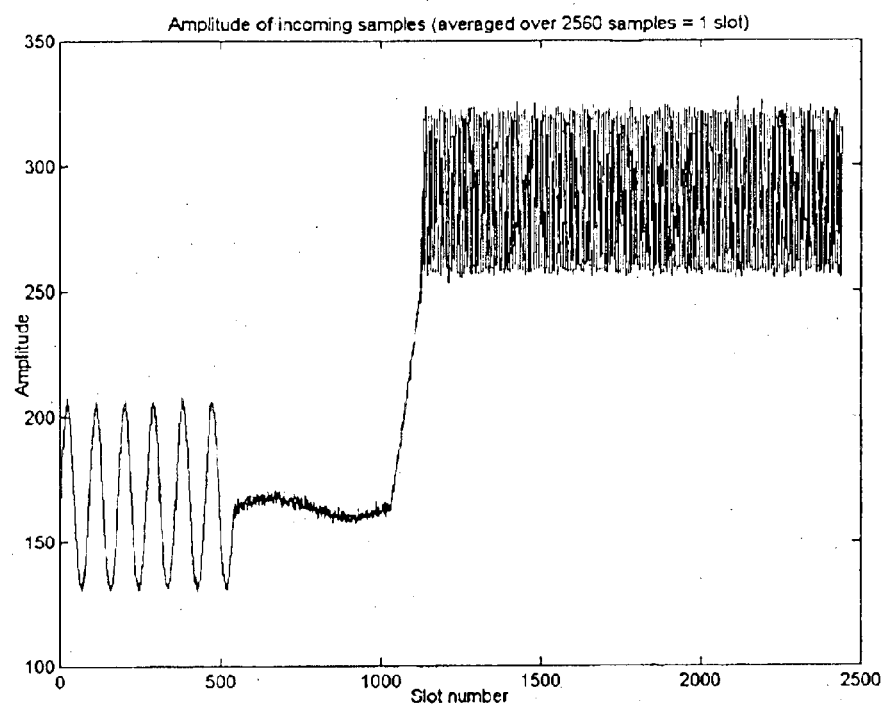
FIG. 3 represents the amplitude of an incoming signal.

FIG. 3 shows the incoming signal amplitude (averaged over 2560 samples=1 slot). A clear change in the signal dynamics can be noticed.

Figure 4:
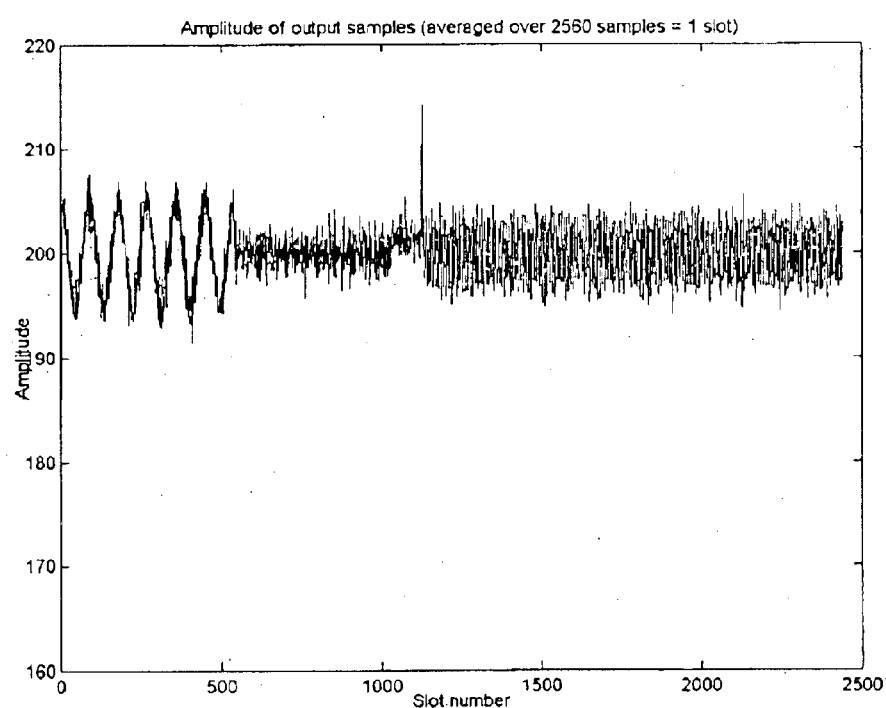
FIG. 4 represents the amplitude of the ADC output samples with the classical approach.
Figure 5:
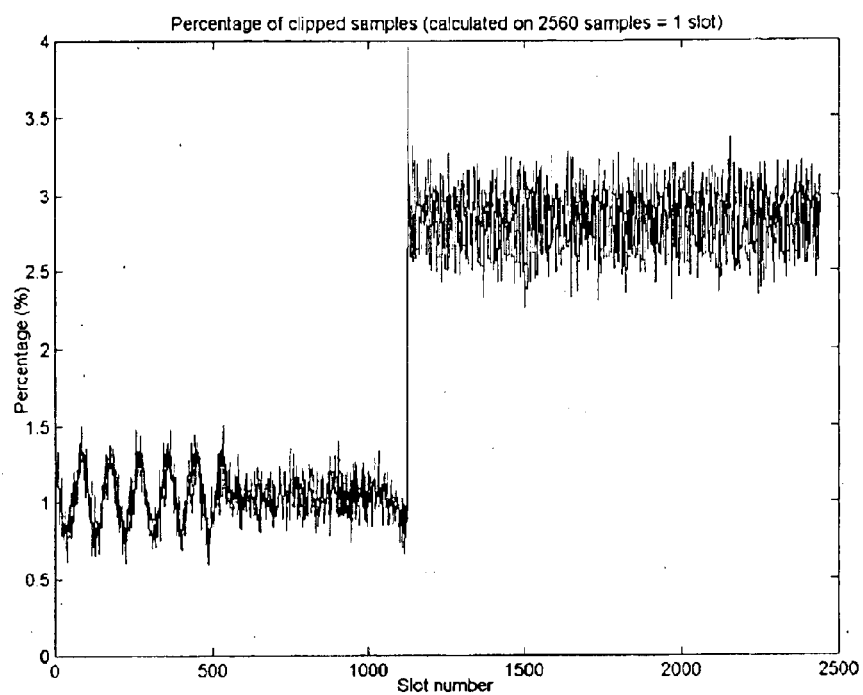
FIG. 5 represents the clipping percentage with the classical approach.

In FIG. 4 the amplitude of the ADC output samples (again averaged over 1 slot) is shown in case of the classical approach. The corresponding clipping percentage is given in FIG. 5. The algorithm performs well as long as the received signal has low dynamics. A stronger received signal leads to a rise in the percentage of clipped samples. The ADC dynamic range is not used optimally anymore, as can be seen in FIG. 4.

Figure 6:
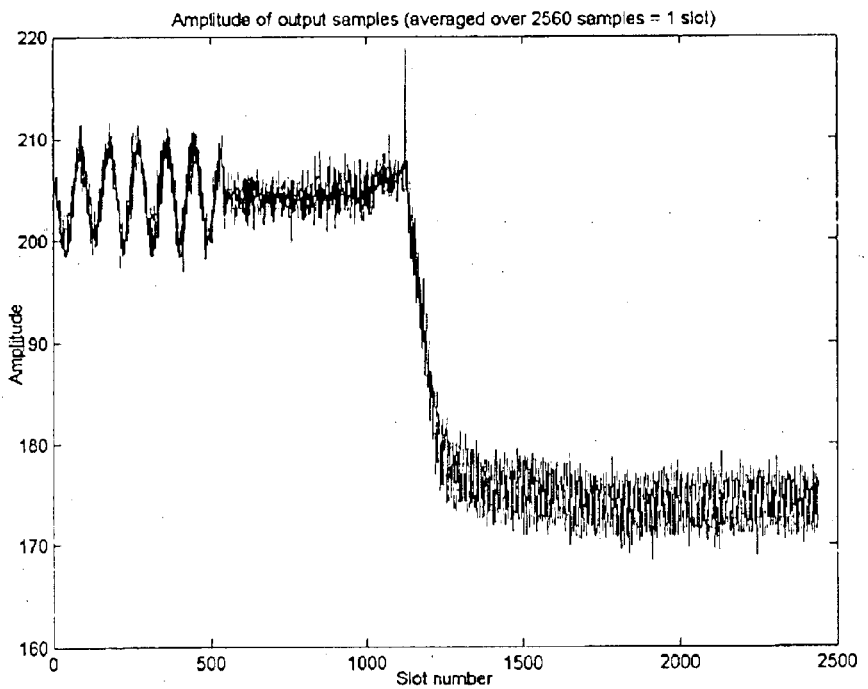
FIG. 6 represents the amplitude of the ADC output samples with the method of the invention.
Figure 7:
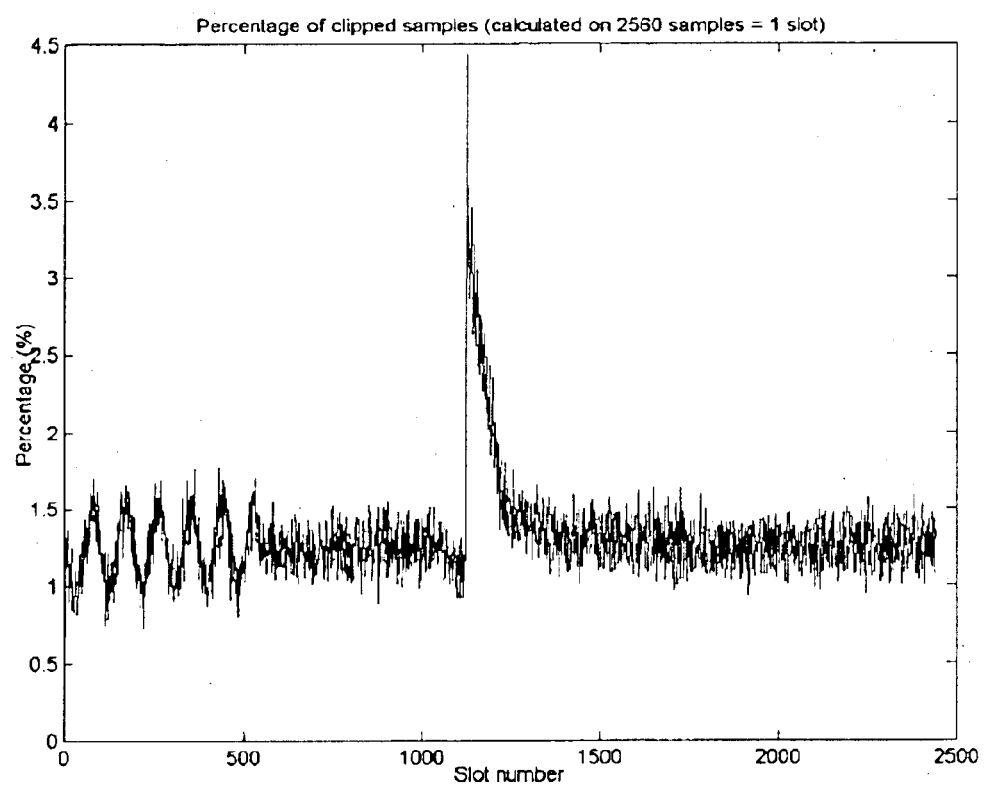
FIG. 7 represents the clipping percentage with the method of the invention.

FIG. 6 and FIG. 7 represent the amplitude of the ADC output samples with the method of the invention and the clipping percentage, respectively. Both show results averaged over 1 slot. Thanks to the adaptation of the target energy value in the approach described in the invention and thus the gain setting, the clipping percentage can quickly be reduced to an acceptable level.

What is claimed is:

1. A method to provide an automatic gain control (AGC) in a receiver structure, comprising:

multiplying a received analogue signal with a predetermined gain setting to obtain an amplifier output signal, sampling the amplifier output signal, estimating the energy in the samples, calculating the average energy, computing a percentage of clipped samples, setting a target energy value base on the percentage of clipped samples, updating the gain setting based on the target energy value and the average energy, and applying the updated gain setting.

2. A method, according to claim 1, to provide an automatic gain control (AGC) in a receiver structure, wherein a lower and upper limit are set for the target energy value and th target energy value is calculated as follows:

if clipping percentage is below the lower limit, the target energy value is increased, if clipping percentage is between lower and upper limit the target energy remains unchanged, if clipping percentage is above the upper limit the target energy value is decreased.

3. An automatic gain control apparatus to control received RE power, comprising:

an adjustable gain amplifier arranged for amplifying a received signal, an A/D converter arranged for generating samples of the amplified signal, a clipping & energy estimation block, arrange for the calculation of the clipping percentage and the average energy of the sampled signal and a gain calculation block, arranged for determining the target energy value based on the clipping percentage and the gain setting of said adjustable gain amplifier.

4. The AGC apparatus of claim 3 incorporated in a receiver apparatus.

5. An integrated circuit device or a set of integrated circuit devices, comprising an automatic gain control apparatus as in claim 3.

* * * * *